United States Patent
Park

(10) Patent No.: US 6,765,839 B2
(45) Date of Patent: Jul. 20, 2004

(54) REFRESH CIRCUIT HAVING VARIABLE RESTORE TIME ACCORDING TO OPERATING MODE OF SEMICONDUCTOR MEMORY DEVICE AND REFRESH METHOD OF THE SAME

(75) Inventor: Jong-Yeol Park, Goyang-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/351,008

(22) Filed: Jan. 24, 2003

(65) Prior Publication Data

US 2003/0198099 A1 Oct. 23, 2003

(30) Foreign Application Priority Data

Apr. 18, 2002 (KR) ........................................ 2002-21183

(51) Int. Cl.[7] ................................................ G11C 7/00
(52) U.S. Cl. ...................................... 365/222; 365/229
(58) Field of Search ................................ 365/222, 228, 365/229, 230.06, 233

(56) References Cited

U.S. PATENT DOCUMENTS 6,134,167 A * 10/2000 Atkinson .................... 365/222
6,285,578 B1 * 9/2001 Huang ........................ 365/154
6,625,077 B2 * 9/2003 Chen .......................... 365/222
2004/0027888 A1 * 2/2004 Kurita ........................ 365/202

* cited by examiner

Primary Examiner—Gene N. Auduong
(74) Attorney, Agent, or Firm—F. Chau & Associates, LLC

(57) ABSTRACT

A refresh circuit having a variable restore time according to an operating mode of a semiconductor memory device and a refresh method of the same is provided. The refresh circuit includes a refresh pulse generating unit for receiving a clock signal to generate first and second refresh signals, a standby refresh signal generating unit for receiving the second refresh signal and a chip select signal to generate a standby refresh signal, the chip select signal representing an active state and a standby state of the semiconductor memory device, and a word-line pulse generating unit for receiving the first refresh signal and the standby refresh signal to generate a word-line driving signal. A pulse width of the word-line driving signal generated at the standby state is longer than that generated at the active state resulting in a sufficient refresh time at each memory cell.

16 Claims, 6 Drawing Sheets

REFRESH CIRCUIT HAVING VARIABLE RESTORE TIME ACCORDING TO OPERATING MODE OF SEMICONDUCTOR MEMORY DEVICE AND REFRESH METHOD OF THE SAME

BACKGROUND OF THE INVENTION

1. Field of the Invention

The present invention relates to a semiconductor memory device, and more particularly, to a refresh circuit having a variable restore time according to an operating mode of a semiconductor memory device and a refresh method of the same.

2. Discussion of the Related Art

A semiconductor memory device such as a dynamic random access memory (DRAM) includes memory cell circuits, each of which consists of one transistor and one capacitor. In the DRAM, while a data is stored in the capacitor, the data can be temporarily retained for several milliseconds. Therefore, the memory cells of the DRAM need to be periodically refreshed. In general, the refresh operation is performed between memory access operations so that an execution of operations requested by a central processing unit (CPU) cannot be interrupted. A refresh circuit must drive respective word lines of the DRAM within a refresh time by one time and a counter must drive the word lines by sequentially incrementing an address of the word lines. During a refresh cycle, the CPU cannot utilize the DRAM and a memory controller controls a memory use request of the CPU and a request of the refresh circuit.

Meanwhile, the refresh operation can be achieved when a chip select signal (CSb) is activated or inactivated to an active state or a standby state, respectively. A data restore time for refreshing a memory cell data is equal in both the active state and the standby state. Therefore, in the standby state of the DRAM, if a refresh time is prolonged by extending the data restore time, it is possible to secure a margin for sufficiently refreshing the memory cell data. In addition, there is an advantage that the standby state of the DRAM can be fully utilized.

Accordingly, there is a demand for a refresh circuit having different restore times in the active state and the standby state of the DRAM.

SUMMARY OF THE INVENTION

According to one aspect of the present invention, a refresh circuit capable of extending a refresh time in a standby state of a semiconductor memory device is provided.

According to another aspect of the present invention, a refresh method of a semiconductor memory device is provided.

The refresh circuit in accordance with the present invention includes a self-refresh oscillator, a refresh pulse generating unit, a standby refresh signal generating unit and a word-line pulse generating unit. The self-refresh oscillator generates a clock signal having a predetermined period and a refresh pulse generating unit receives the clock signal to generate first and second refresh signals. The standby refresh signal generating unit receives the second refresh signal and a chip select signal to generate a standby refresh signal, in which the chip select signal is a signal representing an active state and a standby state of a semiconductor memory device. The word-line pulse generating unit receives the first refresh signal and the standby refresh signal to generate a word-line driving signal. A pulse width of the word-line driving signal generated at the standby state is longer than that of the word-line driving signal generated at the active state.

The self-refresh oscillator includes an inverter chain unit including an odd number of inverters; a buffer unit for buffering an output of the inverter chain unit to generate the clock signal; and a delay unit coupled between a first inverter and a final inverter among the odd number of the inverters. The inverter chain unit further includes a cutoff unit coupled between an output of a first inverter and a ground voltage and between an output of a final inverter and a power supply voltage, wherein the first and final inverters are contained in the odd number of the inverters. The refresh pulse generating unit includes a first delay chain unit for delaying the clock signal by a first predetermined time; a first NOR gate for receiving the clock signal and an output of the first delay chain unit to generate the first refresh signal; a second delay chain unit for delaying an output of the first NOR gate by a second predetermined time; a second NOR gate for receiving the output of the fist NOR gate and an output of the second delay unit; and an inverter for receiving an output of the second NOR gate to generate the second refresh signal.

The standby refresh signal generating unit includes a NAND gate for receiving the second refresh signal and the standby refresh signal; a first inverter for receiving an output of the NAND gate to generate a transmission signal; a second inverter for receiving an output of the first inverter to generate an inverted transmission signal; a first latch unit responsive to the transmission signal and the inverted transmission signal, for receiving a preliminary standby refresh signal; and a second latch unit for receiving an output of the first latch unit to generate the preliminary standby refresh signal and the standby refresh signal in response to the transmission signal and the inverted transmission signal.

The word-line pulse generating unit includes a first delay unit for delaying the first refresh signal by a first predetermined time; a second delay unit for delaying an output of the first delay unit by a second predetermined time; a transmission unit for selectively transmitting the outputs of the first and second delay units in response to the standby refresh signal and an inverted standby refresh signal; a latch unit for latching an output of the transmission unit; a first inverter for receiving an output of the latch unit; a NOR gate for receiving an output of the first inverter and the first refresh signal; and a second inverter for receiving an output of the NOR gate to generate the word-line driving signal.

According to a further aspect of the present invention, there is provided a method for refreshing a semiconductor memory device, comprising the steps of a) generating a clock signal having a predetermined period by an odd number of inverter chains and a delay means; b) changing an operating mode of the semiconductor memory device from an active state to a standby state in response to a chip select signal; c) generating first and second refresh signals in response to the clock signal, the first and second refresh signals having first and second pulse widths, respectively; d) generating a standby refresh signal in response to the second refresh signal and the chip select signal, the chip select signal indicating that the operating mode is changed to the standby state; and e) generating a word-line driving signal in response to the first refresh signal and the standby refresh signal. At this time, a pulse width of the word-line driving signal generated at the standby state is longer than that of the word-line driving signal generated at the active state.

In accordance with the present invention, since the refresh time is long at the standby state, a sufficient refresh can be achieved at each memory cell and the power consumption needed for the refresh operation can reduced.

BRIEF DESCRIPTION OF THE DRAWINGS

The accompanying drawings, which are included to provide a further understanding of the invention and are incorporated in and constitute a part of this application, illustrate embodiments of the invention and, together with the description, serve to explain the principles of the invention. In the drawings.

and

Figure 1:
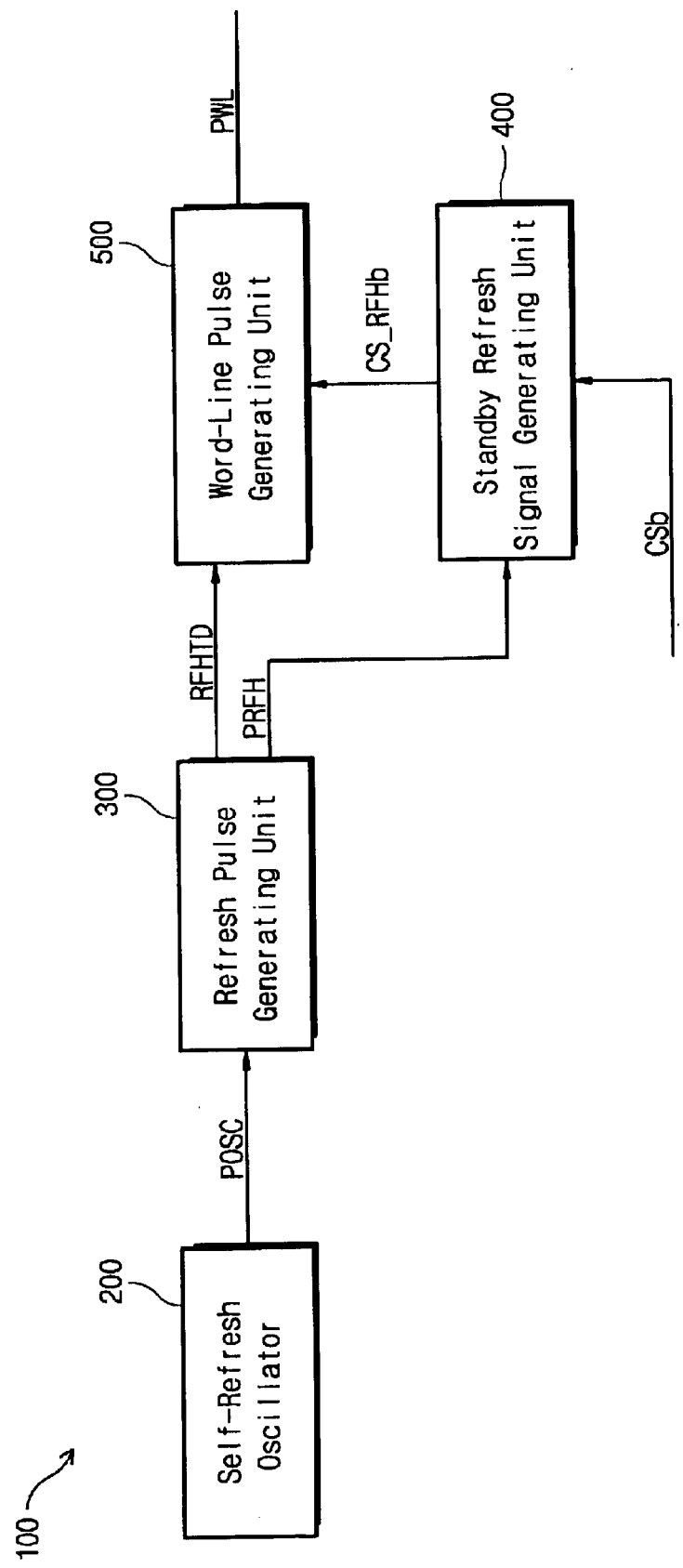
FIG. 1 is a block diagram of a refresh circuit in accordance with an embodiment of the present invention.
Figure 6:
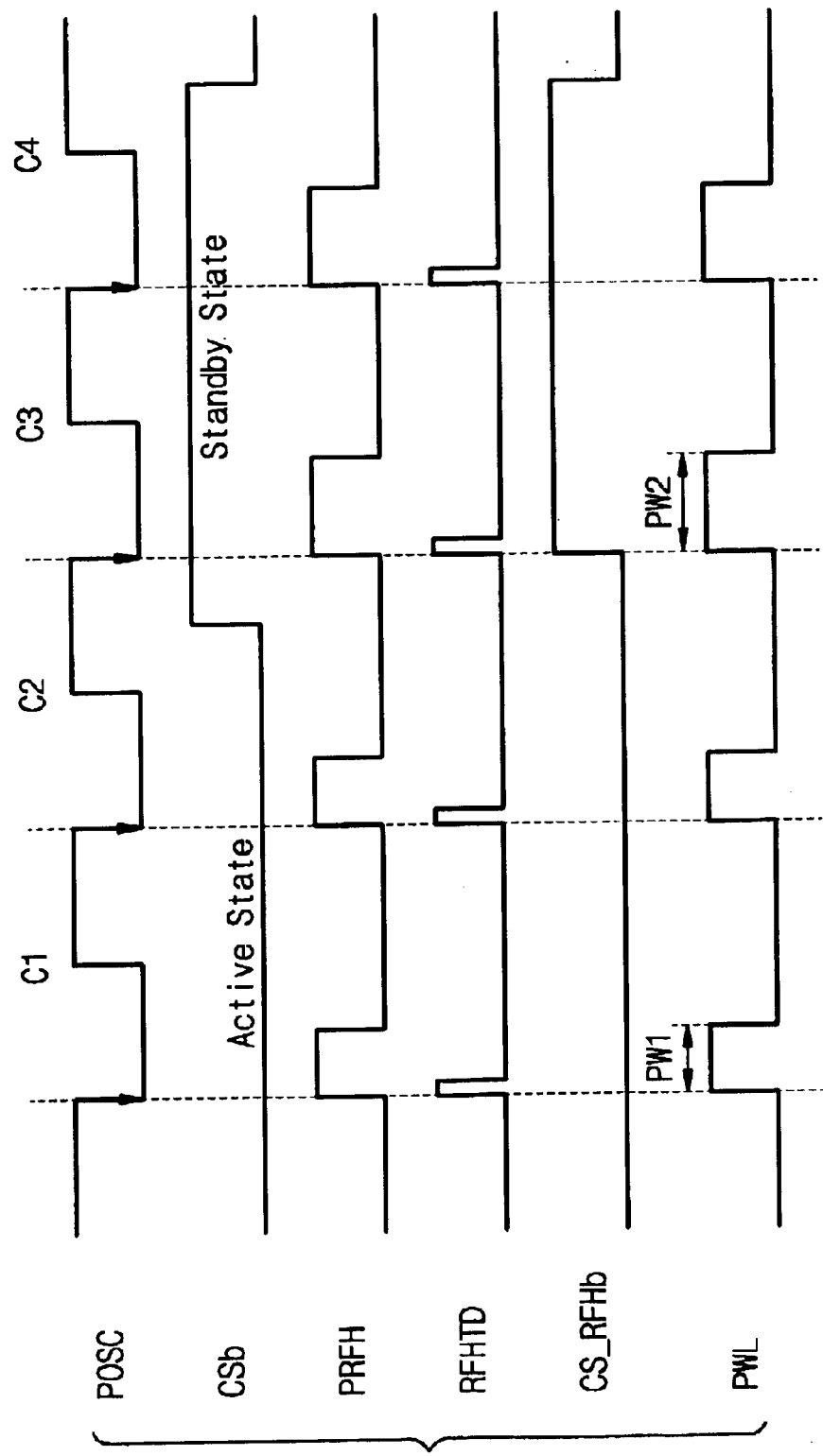

FIG. 6 is a timing chart of the refresh circuit shown in FIG. 1.

DETAILED DESCRIPTION OF THE INVENTION

Hereinafter, a refresh circuit contained in a semiconductor memory device and a refresh method of the same will be described in detail.

FIG. 1 is a block diagram of a refresh circuit 100 in accordance with an embodiment of the present invention. Referring to FIG. 1, the refresh circuit 100 of the present invention includes a self-refresh oscillator 200, a refresh pulse generating unit 300, a standby refresh signal generating unit 400 and a word-line pulse generating unit 500. The self-refresh oscillator 200 generates a clock signal POSC having a predetermined period. The refresh pulse generating unit 300 receives the clock signal POSC to generate first and second refresh signals RFHTD and PRFH. The standby refresh signal generating unit 400 receives the second refresh signal PRFH and a chip select signal CSb to generate a standby refresh signal CS_RFHb. The word-line pulse generating unit 500 receives the first refresh signal RFHTD and the standby refresh signal CS_RFHb to generate a word-line driving signal PWL.

Figure 2:
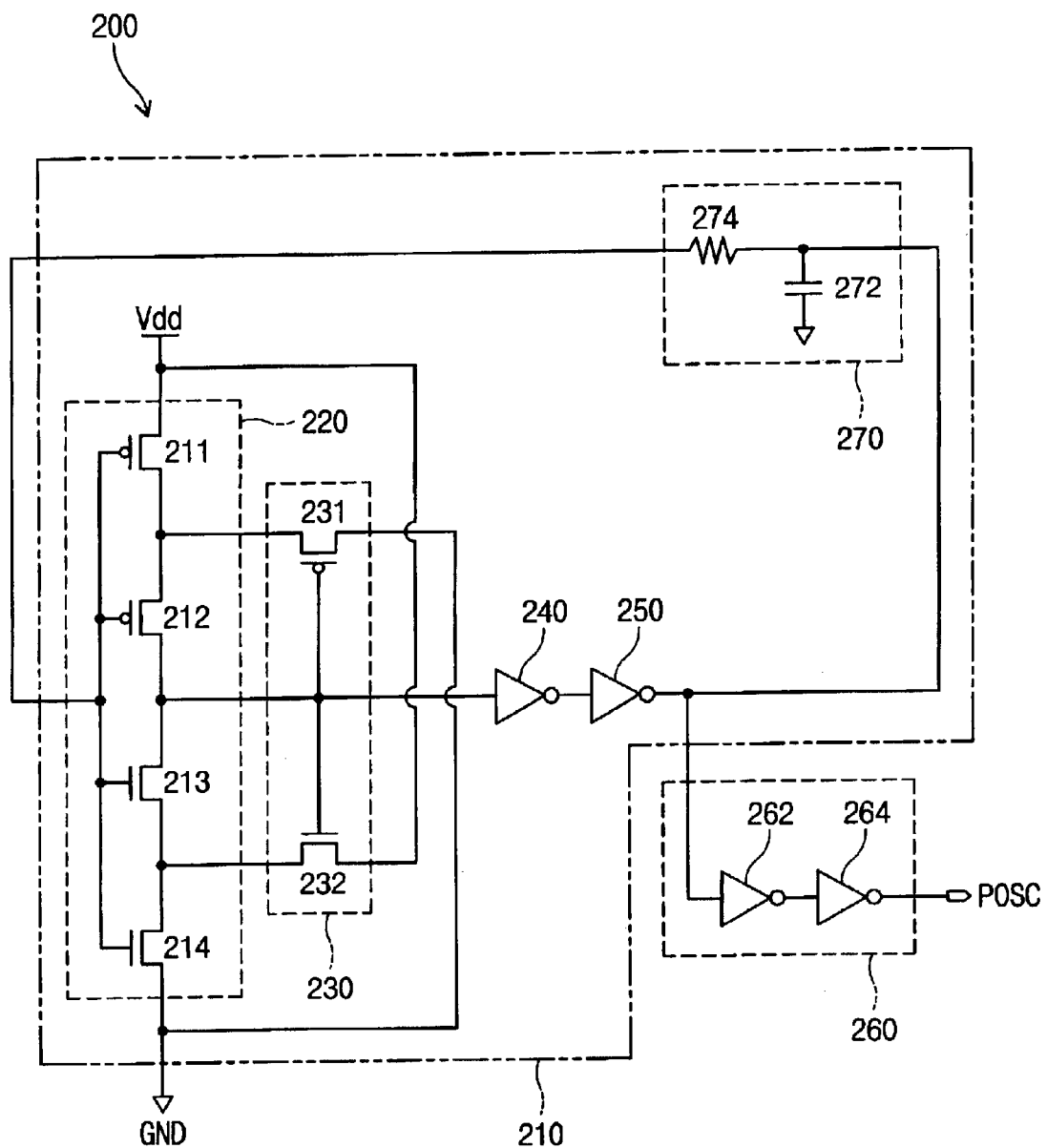
FIG. 2 is a circuit diagram of the self-refresh oscillator shown in FIG. 1.

FIG. 2 is a circuit diagram of the self-refresh oscillator 200 shown in FIG. 1. Referring to FIG. 2, the self-refresh oscillator 200 includes an inverter chain unit 210 and a buffer unit 260. The inverter chain unit 210 is provided with an odd numbers of inverter, which include a first inverter 220, a second inverter 240 and a third inverter 250. The inverter chain unit 210 further includes a delay unit 270 coupled between the first inverter 220 and the third inverter 250.

The first inverter 220 includes first to fourth transistors 211, 212, 213 and 214, of which gates are coupled to the delay unit 270, and of which sources and drains are serially coupled between a power supply voltage Vdd and a ground voltage GND. Drains of the second and third transistors 212 and 213 become an output of the first inverter 220. A cutoff unit 230 responsive to the output of the first inverter 220 includes a first transistor 231 and a second transistor 232. The first transistor 231 is coupled between the ground voltage GND and the drain of the first transistor 211 contained in the first inverter 220, and the second transistor 232 is coupled between the power supply voltage Vdd and the drain of the fourth transistor 214 contained in the first inverter 220.

If the output of the first inverter 220 is a low level, the first transistor 231 of the cutoff unit 230 is turned on, so that the drain of the first transistor 211 contained in the first inverter 220 becomes a low level. At this time, an input of the first inverter 220 is a high level. Although the second transistor 212 of the first inverter 220 is turned off since the input of the first inverter 220 is a high level, the power supply voltage Vdd is cut off by the first transistor 231 of the cutoff unit 230. As a result, the first inverter 220 has a stable low level. Meanwhile, if the output of the first inverter 220 is a high level, the second transistor 232 of the cutoff unit 230 is turned on, so the drain of the fourth transistor 214 contained in the first inverter 220 becomes a high level. At this time, the input of the first inverter 220 is a low level. Although the fourth transistor 214 of the first inverter 220 is turned off since the input of the first inverter 220 is a low level, the ground voltage Vdd is cut off by the second transistor 232 of the cutoff unit 230. As a result, the first inverter 220 has a stable high level.

The delay unit 270 includes a capacitor 272 coupled to an output of the third inverter 250 and a resistor 274 coupled between the capacitor 272 and the input of the first inverter 220. The delay unit 270 delays the output of the inverter chain unit 210 by a predetermined time. The buffer unit 260 includes first and second inverters 262 and 264 for buffering the output of the inverter chain 210 to generate the clock signal POSC.

Figure 3:
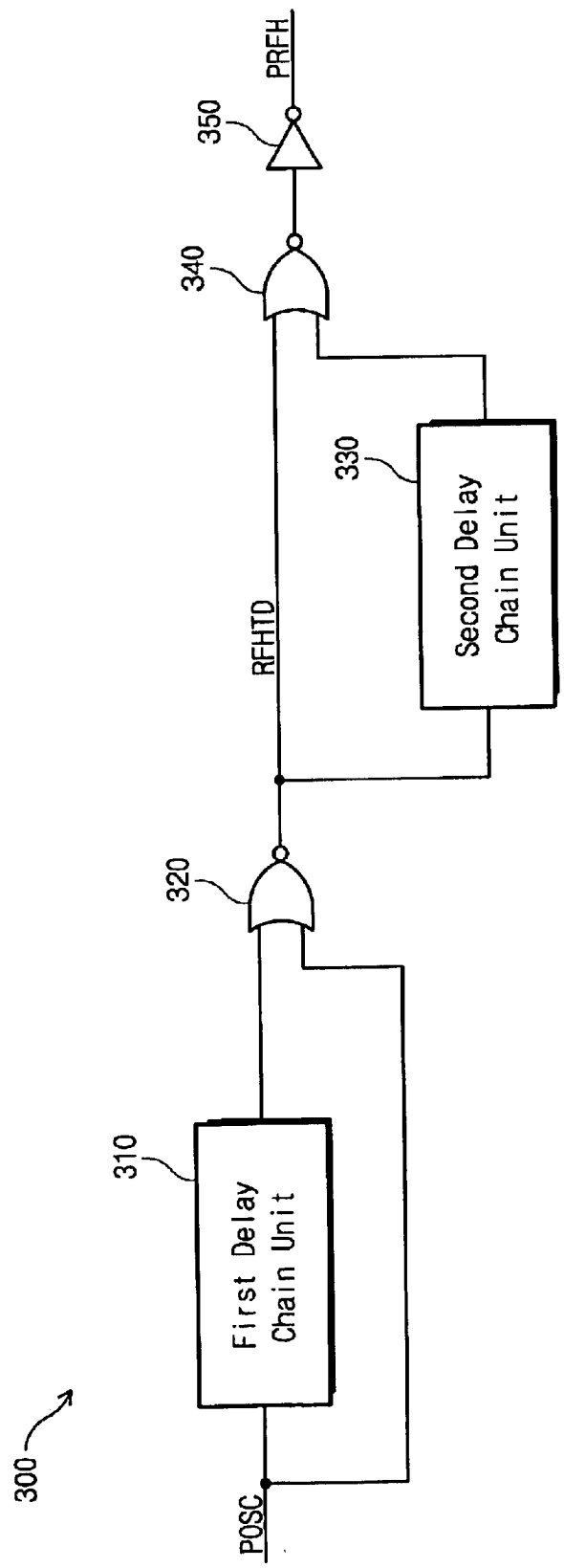
FIG. 3 is a schematic diagram of the refresh pulse generating unit shown in FIG. 1.

FIG. 3 is a schematic diagram of the refresh pulse generating unit 300 shown in FIG. 1. Referring to FIG. 3, the refresh pulse generating unit 300 includes a first delay chain unit 310, a first NOR gate 320, a second delay chain unit 330, a second NOR gate 340 and an inverter 350. The first delay chain unit 310 is provided with an odd number of inverter chains and delays the clock signal POSC by a predetermined time. The first NOR gate 320 receives the clock signal POSC and an output of the first delay chain unit 310 to generate the first refresh signal RFHTD. The second delay chain unit 330 is provided with an even number of inverter chains and delays the first refresh signal RFHTD by a predetermined time. The second NOR gate 340 receives the output of the NOR gate 320 and the output of the second delay chain unit 330. The inverter 350 receives an output of the second NOR gate 340 to generate the second refresh signal PRFH. The first refresh signal RFHTD and the second refresh signal PRFH are supplied to the word-line pulse generating unit 500 and the standby refresh signal generating unit 400, respectively.

Figure 4:
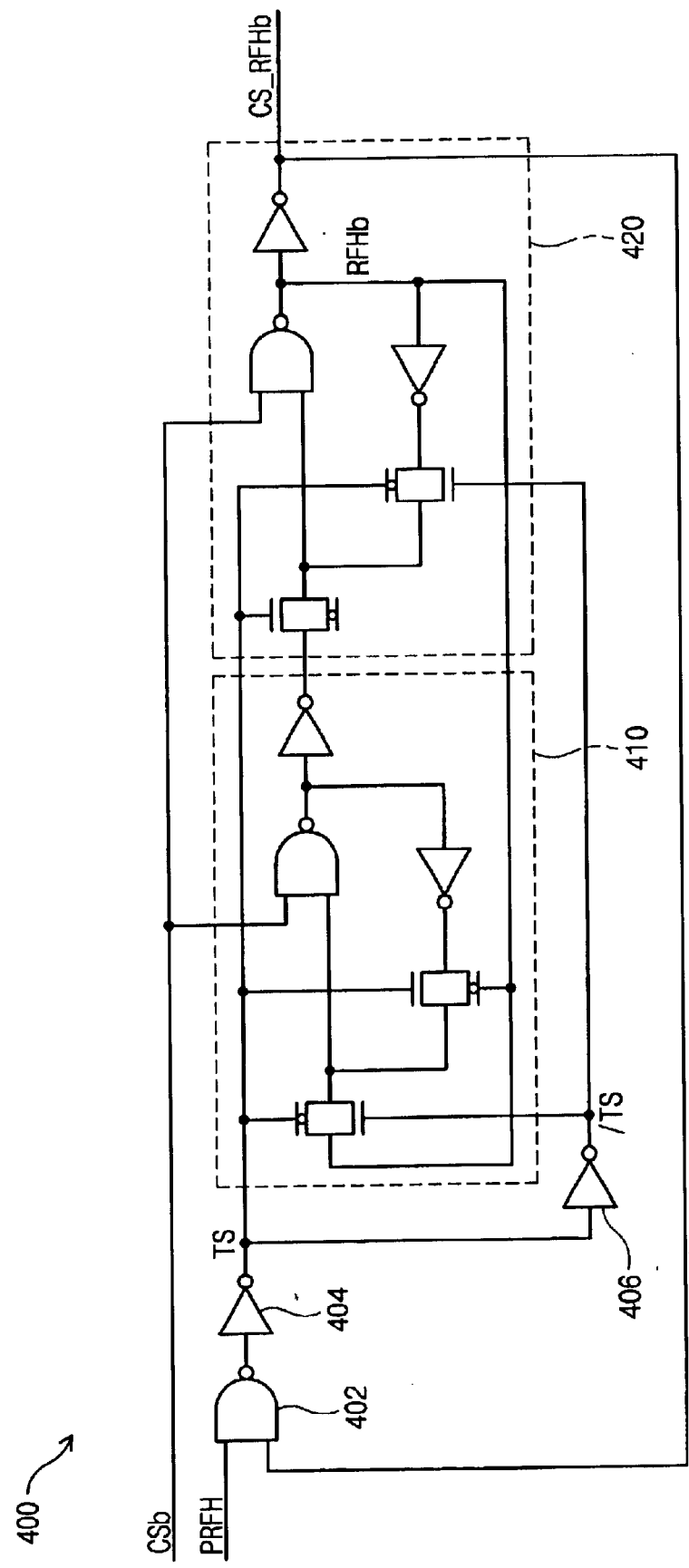
FIG. 4 is a circuit diagram of the standby refresh signal generating unit shown in FIG. 1.

FIG. 4 is a circuit diagram of the standby refresh signal generating unit 400 shown in FIG. 1. Referring to FIG. 4, the standby refresh signal generating unit 400 includes a NAND gate 402, a first inverter 404, a second inverter 406, a first latch unit 410 and a second latch unit 420. The NAND gate 402 receives the second refresh signal PRFH and the standby refresh signal CS_RFHb, and the first inverter 404 receives an output of the NAND gate 402 to generate a transmission signal TS. The second inverter 406 receives the transmission signal TS to generate an inverted transmission signal/TS. The first latch unit 410 receives a preliminary standby refresh signal RFHb and provides its output to the second latch unit 420 in response to the transmission signal TS and the inverted transmission signal/TS. The second latch unit 420 receives the output of the first latch unit 410 and generates the preliminary standby refresh signal RFHb and the standby refresh signal CS_RFHb in response to the transmission signal TS and the inverted transmission signal/TS.

Figure 5:
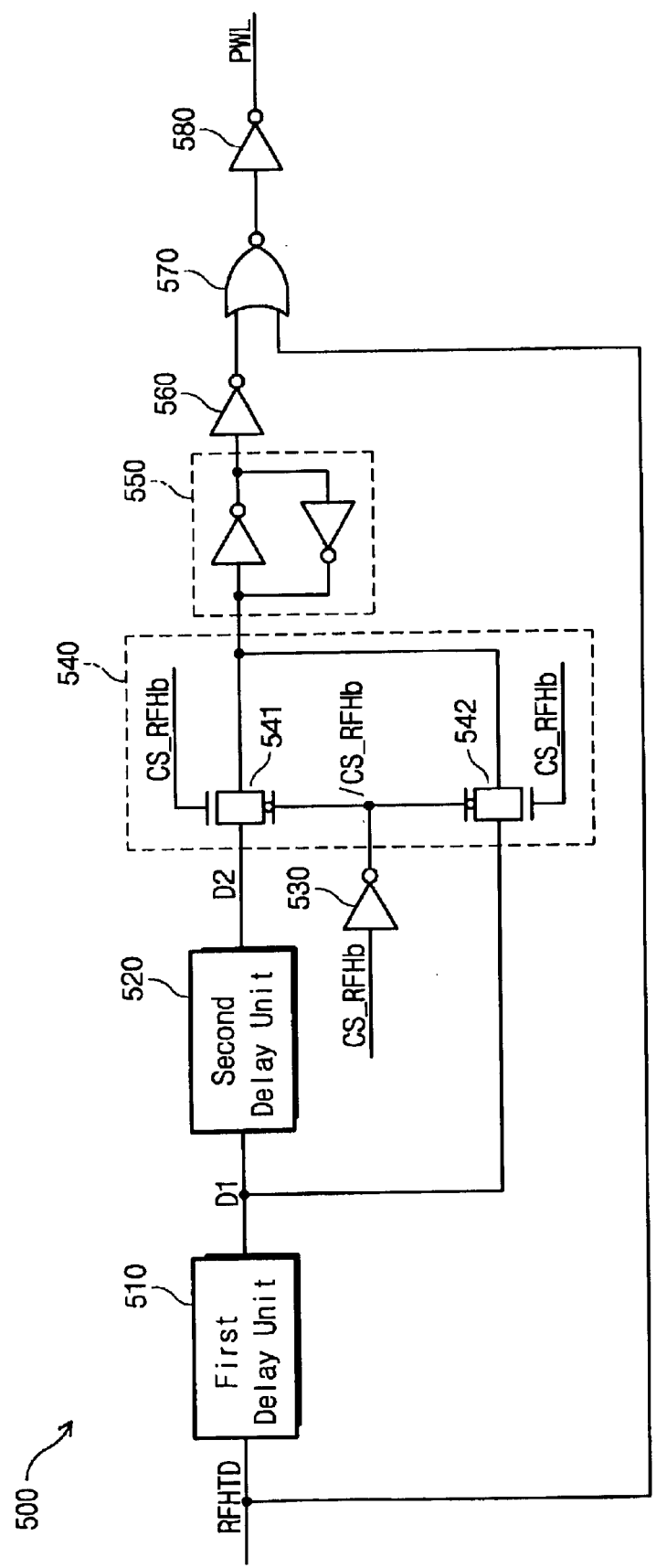
FIG. 5 is a schematic diagram of the word-line pulse generating unit shown in FIG. 1.

FIG. 5 is a schematic diagram of the word-line pulse generating unit 500 shown in FIG. 1. Referring to FIG. 5, the word-line pulse generating unit 500 includes a first delay unit 510, a second delay unit 520, a first inverter 530, a transmission unit 540, a latch unit 550, a second inverter 560, a NOR gate 570 and a third inverter 580. The first delay unit 510 delays the first refresh signal RFHTD by a predetermined time, and the second delay unit 520 delays an output of the first delay unit 510 by a predetermined time. The first inverter 530 receives the standby refresh signal CS_RFHb to generate an inverted standby refresh signal/CS_RFHb. The transmission unit 540 selectively transmits outputs D1 and D2 of the first and second delay units 510 and 520 in response to the standby refresh signal CS_RFHb and the inverted standby refresh signal/CS_RFHb. The latch unit 550 latches an output of the transmission unit 540, and the second inverter 560 receives an output of the latch unit 550. The NOR gate 570 receives an output of the second inverter 560 and the first refresh signal RFHTD, and the third inverter 580 receives an output of the NOR gate 570 to generate the word-line driving signal PWL.

FIG. 6 is a timing chart of the refresh circuit 100, which includes the self-refresh oscillator 200, the refresh pulse generating unit 300, the standby refresh signal generating unit 400 and the word-line pulse generating unit 500.

Referring to FIG. 6, the self-refresh oscillator 200 generates the clock signal POSC having a predetermined period. The chip select signal CSb is activated to the active state of the low level and then inactivated to the standby state of the high level. The refresh pulse generating unit 300 generates the first and second refresh signals RFHTD and PRFH, which are pulse signals having predetermined pulse widths, in response to each falling edge of the clock signal POSC. At this time, a pulse width of the first refresh signal RFHTD is narrower than that of the second refresh signal PRFH. Thereafter, the chip select signal CSb is inactivated to the standby state of the high level and then the standby refresh signal generating unit 400 generates the standby refresh signal CS_RFHb at the clock C3.

The word-line pulse generating unit 500 generates the word-line driving signal PWL in response to the standby refresh signal CS_RFHb and each falling edge of the first refresh signal RFHTD. At this time, a first pulse width PW1 of the word-line driving signal PWL generated at the active state of the chip select signal CSb is different from a second pulse width PW2 of the word-line driving signal PWL generated at the standby state of the chip select signal CSb. In other words, the second pulse width PW2 is longer than the first pulse width PW1.

Accordingly, in the case where the refresh operation is performed in response to the word-line driving signal PWL generated by the refresh circuit of the present invention, a sufficient refresh can be achieved at each memory cell since the refresh time is long at the standby state. Further, when the operating mode of the semiconductor memory device is the standby state, a time interval for performing the refresh operation can be increased, so that the power consumption is reduced.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A refresh circuit for a semiconductor memory device comprising:
    a self-refresh oscillator for generating a clock signal having a predetermined period;
    a refresh pulse generating unit for receiving the clock signal to generate first and second refresh signals;
    a standby refresh signal generating unit for receiving the second refresh signal and a chip select signal to generate a standby refresh signal, the chip select signal being a signal representing an active state and a standby state of the semiconductor memory device; and
    a word-line pulse generating unit for receiving the first refresh signal and the standby refresh signal to generate a word-line driving signal,
    wherein a pulse width of the word-line driving signal generated at the standby state is longer than that of the word-line driving signal generated at the active state.

2. The refresh circuit of claim 1, wherein the self-refresh oscillator includes:
    an inverter chain unit including an odd number of inverters; and
    a buffer unit for buffering an output of the inverter chain unit to generate the clock signal.

3. The refresh circuit of claim 2, wherein the inverter chain unit further includes a delay unit coupled between a first inverter and a final inverter among the odd number of the inverters.

4. The refresh circuit of claim 2, wherein the inverter chain unit further includes a cutoff unit, the cutoff unit being coupled between an output of a first inverter and a ground voltage and between an output of a final inverter and a power supply voltage, the first and final inverters being contained in the odd number of the inverters.

5. The refresh circuit of claim 1, wherein the refresh pulse generating unit includes:
    a first delay chain unit for delaying the clock signal by a first predetermined time;
    a first NOR gate for receiving the clock signal and an output of the first delay chain unit to generate the first refresh signal;
    a second delay chain unit for delaying an output of the first NOR gate by a second predetermined time;
    a second NOR gate for receiving the output of the first NOR gate and an output of the second delay unit; and
    an inverter for receiving an output of the second NOR gate to generate the second refresh signal.

6. The refresh circuit of claim 5, wherein the first delay chain unit includes an odd number of inverter chains.

7. The refresh circuit of claim 5, wherein the second delay chain unit includes an even number of inverter chains.

8. The refresh circuit of claim 1, wherein the standby refresh signal generating unit includes:
    a NAND gate for receiving the second refresh signal and the standby refresh signal;
    a first inverter for receiving an output of the NAND gate to generate a transmission signal;
    a second inverter for receiving an output of the first inverter to generate an inverted transmission signal;
    a first latch unit responsive to the transmission signal and the inverted transmission signal, for receiving a preliminary standby refresh signal; and
    a second latch unit for receiving an output of the first latch unit to generate the preliminary standby refresh signal and the standby refresh signal in response to the transmission signal and the inverted transmission signal.

9. The refresh circuit of claim 1, wherein the word-line pulse generating unit includes:
   a first delay unit for delaying the first refresh signal by a first predetermined time;
   a second delay unit for delaying an output of the first delay unit by a second predetermined time;
   a transmission unit for selectively transmitting the outputs of the first and second delay units in response to the standby refresh signal and an inverted standby refresh signal;
   a latch unit for latching an output of the transmission unit;
   a first inverter for receiving an output of the latch unit;
   a NOR gate for receiving the first refresh signal and an output of the first inverter; and
   a second inverter for receiving an output of the NOR gate to generate the word-line driving signal.

10. A refresh circuit for a semiconductor memory device comprising:
    a self-refresh oscillating means for generating a clock signal having a predetermined period;
    a refresh pulse generating means for receiving the clock signal to generate first and second refresh signals;
    a standby refresh signal generating means for receiving the second refresh signal and a chip select signal to generate a standby refresh signal, the chip select signal being a signal that represents an active state and a standby state of a semiconductor memory device; and
    a word-line pulse generating means for receiving the first refresh signal and the standby refresh signal to generate a word-line driving signal,
    wherein a pulse width of the word-line driving signal generated at the standby state is longer than that of the word-line driving signal generated at the active state.

11. A method for refreshing a semiconductor memory device, the method comprising the steps of:
    changing an operating mode of the semiconductor memory device from an active state to a standby state in response to a chip select signal;
    generating first and second refresh signals in response to a clock signal, the first and second refresh signals having first and second pulse widths, respectively;
    generating a standby refresh signal in response to the second refresh signal and the chip select signal, the chip select signal indicating that the operating mode is changed to the standby state; and
    generating a word-line driving signal in response to the first refresh signal and the standby refresh signal,
    wherein a pulse width of the word-line driving signal generated at the standby state is longer than that of the word-line driving signal generated at the active state.

12. The method of claim 11, further comprising the step of generating the clock signal having a predetermined period by an odd number of inverter chains and a delay means.

13. The method of claim 11, wherein the first pulse width is narrower than the second pulse width.

14. The method of claim 11, wherein the first and second refresh signals are generating by a refresh pulse generating unit including:
    a first delay chain unit for delaying the clock signal by a first predetermined time;
    a first NOR gate for receiving the clock signal and an output of the first delay chain unit to generate the first refresh signal;
    a second delay chain unit for delaying an output of the first NOR gate by a second predetermined time;
    a second NOR gate for receiving the output of the first NOR gate and an output of the second delay unit; and
    an inverter for receiving an output of the second NOR gate to generate the second refresh signal.

15. The method of claim 11, wherein the standby refresh signal is generated by a standby refresh signal generating unit including:
    a NAND gate for receiving the second refresh signal and the standby refresh signal;
    a first inverter for receiving an output of the NAND gate to generate a transmission signal;
    a second inverter for receiving an output of the first inverter to generate an inverted transmission signal;
    a first latch unit responsive to the transmission signal and the inverted transmission signal, for receiving a preliminary standby refresh signal; and
    a second latch unit for receiving an output of the first latch unit to generate the preliminary standby refresh signal and the standby refresh signal in response to the transmission signal and the inverted transmission signal.

16. The method of claim 11, wherein the word-line driving signal is generated by a word-line pulse generating unit including:
    a first delay unit for delaying the first refresh signal by a first predetermined time;
    a second delay unit for delaying an output of the first delay unit by a second predetermined time;
    a transmission unit for selectively transmitting the outputs of the first and second delay units in response to the standby refresh signal and an inverted standby refresh signal;
    a latch unit for latching an output of the transmission unit;
    a first inverter for receiving an output of the latch unit;
    a NOR gate for receiving the first refresh signal and an output of the first inverter; and
    a second inverter for receiving an output of the NOR gate to generate the word-line driving signal.

* * * * *